(12) United States Patent
Wang

(10) Patent No.: US 6,229,351 B1
(45) Date of Patent: May 8, 2001

(54) CURRENT MEASURING DEVICE AND TELEPHONE TERMINAL USING SUCH A CURRENT MEASURING DEVICE

(75) Inventor: Zhenhua Wang, Zurich (CH)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/326,895

(22) Filed: Jun. 7, 1999

(30) Foreign Application Priority Data

Jun. 9, 1998  (EP) .................................................. 98201923

(51) Int. Cl.[7] ....................................................... H03K 5/22
(52) U.S. Cl. ................................. 327/77; 327/81; 327/103
(58) Field of Search .................................... 327/101, 102, 327/39, 42, 43, 103, 485, 487, 77, 78, 79, 80, 81

(56) References Cited

U.S. PATENT DOCUMENTS

| | | | |
|---|---|---|---|
| 3,892,983 | * | 7/1975 | Okada et al. ......................... 327/438 |
| 4,064,377 | * | 12/1977 | Regan ............................ 179/170 NC |
| 4,721,957 | * | 1/1988 | Buttle ............................... 340/870.39 |
| 5,430,401 | * | 7/1995 | Shtulman ............................... 327/434 |
| 5,654,661 | * | 8/1997 | Kammiller ............................ 327/438 |

OTHER PUBLICATIONS

Unexamined Japanese Patent Application Laid Open No. 59–221672 (Abstract).

* cited by examiner

Primary Examiner—Timothy P. Callahan
Assistant Examiner—An T. Luu
(74) Attorney, Agent, or Firm—Bernard Franzblau

(57) ABSTRACT

Current measuring device which comprises a current sense resistor (2) for generating a voltage proportional to the current to be measured. The voltage is measured by a MOS transistor (4) having its gate terminal connected to a first terminal of the current sense resistor, and having its source terminal connected to a second terminal of the current sense resistor. The drain current of the MOS transistor is coupled via a current coupling device to the source terminal of a further MOS transistor (10) having its gate and source terminals interconnected. The drain current of the MOS transistor causes a voltage across the further MOS transistor which is proportional to the current in the current sense resistor. This is true only if the voltage across the current sense resistor exceeds the threshold voltage of the MOS transistor. By introducing an offset source (6, 8), an output voltage is obtained which is proportional to the current to be measured for all current values as long as the MOS transistor is conducting.

28 Claims, 3 Drawing Sheets

US 6,229,351 B1

CURRENT MEASURING DEVICE AND TELEPHONE TERMINAL USING SUCH A CURRENT MEASURING DEVICE

BACKGROUND OF THE INVENTION

The present invention relates to a current measuring arrangement for providing at an output terminal an voltage proportional to a current to be measured, said current measuring device comprising a first field effect device and a second field effect device.

The present invention also relates to a voltage measuring device and a telephone terminal using a current measuring device according to the invention.

A current measuring device according to the preamble is known from the Unexamined Japanese Patent Application, Laid Open No. 59-221672.

Such current measuring devices find widespread use in applications in which a voltage should be provided representing a current flowing in a part of an electronic circuit. An example of such an application is a telephone terminal in which it is advantageous to make several transmission parameters dependent on the line current. Examples of such parameters are the gain of microphone and earpiece amplifiers. Also the control of the side tone balance can be made dependent on the DC line current to ensure a correct side tone suppression for all line lengths.

In the current measuring arrangement according to the above mentioned Japanese Patent Application, the current to be measured is applied to the source of a first field effect device. The drain of the first field effect device is connected to the source of a second field effect device. The drain of the second field effect device is connected to a power supply. The gates of the first and second field effect devices are connected to a corresponding reference voltage.

The voltage at the source of the second field effect device will change with the current to be measured because the second field effect device will adjust its gate voltage source to a value corresponding to the input current. This source voltage is applied to a source follower circuit which makes the output signal available at the output terminal.

Because the relation between the gate-source voltage and the drain current of a field effect device is non-linear, the relation between the current to be measured and the output voltage will also be non-linear. In general such a non-linear relationship is undesired in such a measuring arrangement.

SUMMARY OF THE INVENTION

An object of the present invention is to provide a current measuring arrangement according to the preamble in which a linear relation between the current to be measured and the output voltage is obtained.

To achieve said objective, the present invention is characterized in that the current measuring device comprises a current sensing resistor having a first terminal and a second terminal, a gate electrode of the first field effect device being coupled to the first terminal of the current sensing resistor, a source electrode of the first field effect device being coupled to a second terminal of the current sensing resistor, a drain electrode of the first field effect device being coupled to a current coupling device for causing a current dependent on the drain current of the first field effect device to flow in the second field effect device, and an output coupling device for supplying to an output terminal an output voltage derived from the voltage between a gate and a source terminal of the second field effect device.

By converting the voltage over a current sensing resistor into a drain current of the first field effect device, and by converting this drain current into a source-gate voltage of a second field effect device, an output voltage is obtained which is proportional to the voltage across the current sensing resistor. The non-linear of relation between the gate-source voltage and the drain current of the first field effect device is compensated by the same non-linearity of the second field effect device.

An embodiment of the arrangement according to the invention is characterized in that the current measuring device comprises an offset voltage source for offsetting the gate voltage of the first field effect device with respect to the source voltage of the first field effect device.

By offsetting the gate voltage of the first field effect device with respect to the source voltage of the first field effect device, it becomes possible to measure currents resulting in voltages across the sense resistor lower than the threshold voltage of the first field effect device. If the offset voltage is selected in a suitable way, it is possible to measure currents having values starting from 0.

A further embodiment of the arrangement according to the invention is characterized in that the current measuring device comprises a further offset source for offsetting the output voltage of the current measuring device with respect to the voltage between the gate and the source terminal of the second field effect device.

This additional measure makes it possible to obtain an output voltage is obtained which is independent of the value of the offset voltage. This makes it possible to use an offset voltage which is allowed to vary with temperature. This kind of offset voltage can be easily generated on an integrated circuit.

A still further embodiment of the invention is characterized in that the current coupling device comprises a cascode field effect device coupled between the drain terminal of the first field effect device and the source terminal of the second field effect device, the gate of the cascode field effect device being coupled to a reference source.

The introduction of the cascode field effect device has as a result that the output impedance of the first field effect is increased drastically. This results in a reduced influence of the supply voltage on the drain current of the first field effect device. This has as a consequence an improved accuracy of the measuring arrangement.

BRIEF DESCRIPTION OF THE DRAWING

The invention will now be explained with reference to the drawing figures.

DESCRIPTION OF THE PREFERRED EMBODIMENTS

Figure 1:
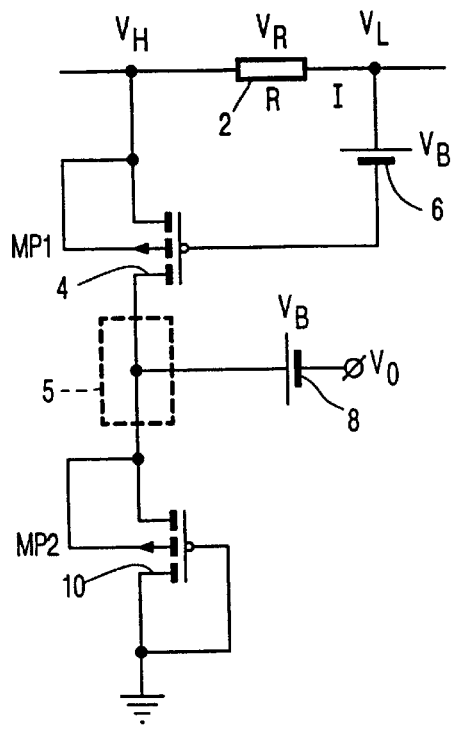
FIG. 1 shows a first embodiment of the current measuring device according to the present invention.

In the current measuring device according to FIG. 1, a first terminal $V_H$ is connected to a first terminal of a resistor 2 with a resistance value R and to a source terminal of a P-MOS transistor 4. Furthermore, the first terminal of the resistor 2 is connected to the bulk terminal of the P-MOS transistor. A second terminal $V_L$ is connected to a second terminal of the resistor 2, and to a positive terminal of an offset voltage source 6 providing an offset voltage $V_B$. A second terminal of the offset source 6 is connected to a gate terminal of the P-MOS transistor 4.

A drain terminal of the P-MOS transistor 4 is connected to an input of a current coupling device 5, which here comprises a simple interconnection. The output of the current coupling device 5 is coupled to the source electrode and the bulk electrode of a P-MOS transistor 10 and to a positive terminal of a further offset voltage source 8.

A drain terminal of the P-MOS transistor 10 and a gate terminal of the P-MOS transistor are connected to a ground terminal.

The current to be measured is conveyed by the measuring resistor 2. The source-gate voltage of the P-MOS transistor 4 is equal to $I \cdot R + V_B$. If it is assumed that the threshold value of the P-MOS transistor 4 is equal to $V_T$ and it is assumed that the P-MOS transistor 4 operates in the saturated region such that the drain current is substantially independent of the drain voltage, the drain current $I_D$ of the P-MOS-transistor 4 can be written:

$$I_D = b_0 \frac{W}{L}(V_{SG} - V_T)^2 \quad (1)$$

$$= b_0 \frac{W}{L}(I \cdot R + V_B - V_T)^2; I \cdot R + V_B > V_T$$

$$I_D = 0; I \cdot R + V_B \leq V_T$$

In (1) $\beta_0$ is the transconductance constant of the P-MOS transistor, W is the width of the MOS transistor and L is the length of the P-MOS transistor. $V_{GS}$ is the gate-source voltage and $V_T$ is the threshold voltage of the P-MOS transistor. The drain current of the P-MOS transistor 4 is forced into the source terminal of the P-MOS transistor 10. This current will cause a voltage drop $V_{GS}'$ across the P-MOS transistor 10. The properties of the P-MOS transistor 10 are chosen equal to the properties of the P-MOS transistor 4. For the relation between the drain current of the P-MOS transistor 10 and the voltage drop $V_{GS}'$ can be found:

$$I_S = b_0 \frac{W}{L}(V_{SG'} - V_T)^2 \quad (2)$$

Because the drain current of the P-MOS transistor 4 and the source current of the P-MOS transistor 10, (1) and (2) can be equated. Consequently, for $V_{GS}'$ it is found:

$$(V_{SG}'-V_T)=(I \cdot R+V_B-V_T); I \cdot R+V_B>V_T \rightarrow$$
$$V_{SG}'=I \cdot R+V_B; I \cdot R+V_B>V_T \quad (3)$$

The output voltage $V_O$ of the current measuring circuit according to FIG. 1 is equal to $V_{SG}'-V_B$. Using (3) gives for $V_O$ a value of $I \cdot R$ if $I \cdot R+V_B>V_T$. Consequently, a linear relationship is found between the output voltage $V_O$ and the current I. If $V_B$ is larger than $V_T$, all values of I larger than 0 can be measured. From the above it can be seen that the output signal $V_O$ is independent of temperature dependent properties $\beta_0$ and $V_T$ of both P-MOS transistors. A prerequisite for this is that the properties of the P-MOS transistors 4 and 10 are equal. This condition is met in general if both P-MOS transistors are integrated on the same die and if they are carefully matched.

If it is known beforehand that $I \cdot R$ is always larger than $V_T$, the offset voltage sources 6 and 8 can be dispensed with. If it can be tolerated that the output voltage $V_O$ has an offset with respect to the value $I \cdot R$, the offset voltage 8 can be dispensed with.

If the resistor R is removed (or is given a high value), the circuit according to FIG. 1 can also be used as a voltage measuring device for deriving a voltage which is proportional to a voltage difference between the terminals $V_H$ and $V_L$.

In the above it is assumed that the drain current of the P-MOS transistors is independent of the drain-source voltage. In practice this is not completely true.

Figure 2:
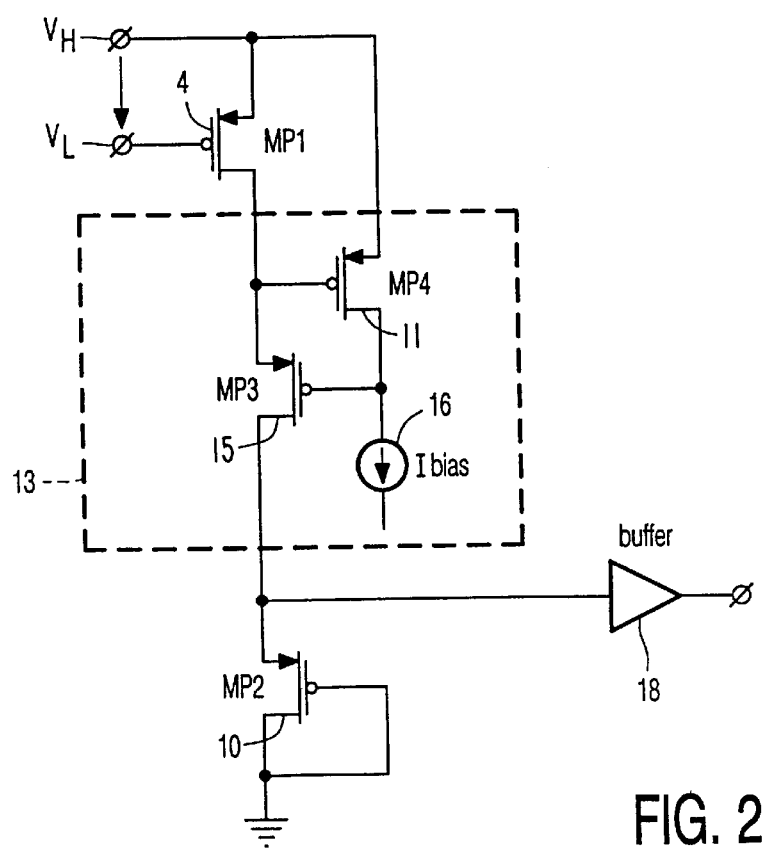
FIG. 2 shows a second embodiment of the current measuring device according to the present invention having an improved accuracy.

FIG. 2 shows an embodiment of the arrangement according to the invention in which the influence of the drain/source voltage of the P-MOS transistors is significantly reduced. In the arrangement according to FIG. 2 the current coupling device 13 comprises a cascode circuit for obtaining a current source with an increased output impedance.

The drain of the P-MOS transistor 4 is connected to a source terminal of a P-MOS transistor 15 and to a gate terminal of a P-MOS transistor 11. A drain terminal of the P-MOS transistor 11 is connected to a gate terminal of the P-MOS transistor 15. The drain terminal of the P-MOS transistor 15 is connected to the source terminal of the P-MOS transistor 10 and to an input of a buffer 18. The output of the buffer 18 constitutes the output of the current measuring arrangement.

The combination of the P-MOS transistors 11 and 15 clamps the drain voltage of the P-MOS transistor 4 to a value which is equal to the gate-source voltage of the P-MOS transistor 11. Due to the serial connection of the P-MOS transistor 15 with the P-MOS transistor 4 a current source with a high output impedance is obtained. This output impedance is further enhanced, because the combination of the P-MOS transistors 11 and 15 acts as a control circuit which tries to keep the voltage on the drain terminal of the P-MOS transistor 4 constant.

Figure 3:
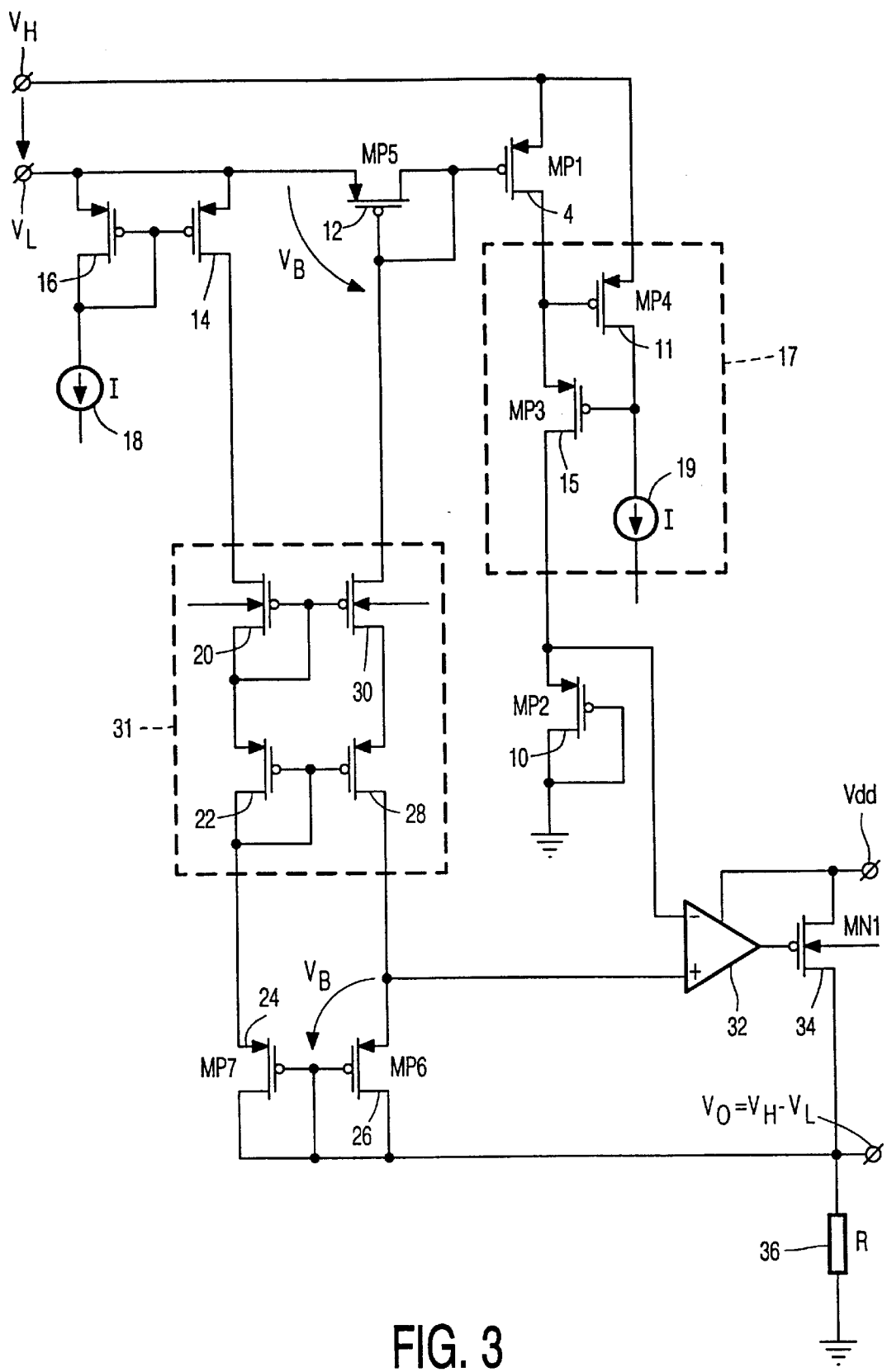
FIG. 3 shows a preferred embodiment of the current measuring device according to the invention.

In the preferred embodiment of the current measuring circuit according to FIG. 3, the offset sources 6 and 8 are introduced. The offset sources 6 and 8 are formed by the P-MOS transistors 12 and 26 which are coupled via a floating current source 31.

The drain-source path of the P-MOS transistor 12 is connected between the terminal $V_L$ and the gate terminal of the P-MOS transistor 4. The gate terminal of the P-MOS transistor 12 is connected to the drain terminal of the same transistor. The offset voltage $V_B$ (offset source 6) is now generated between the source and gate terminal of the P-MOS transistor 12.

The source of the P-MOS transistor 26 is connected to the floating current source 31 and the gate terminal and the drain terminal of the P-MOS transistor 26 are connected to ground.

The floating current source 31 is constituted by a combination of two N-MOS transistors 20 and 30 and two P-MOS transistors 22 and 28. The drain terminal of the N-MOS transistor 20 is connected to the gate terminal of the N-MOS transistor 20 and to the gate terminal of the N-MOS transistor 30. The drain terminal of the N-MOS transistor 20 is connected to the source terminal of the P-MOS transistor 22 and the drain terminal of the N-MOS transistor 30 is connected to the source terminal of the P-MOS transistor 28. The drain terminal of the P-MOS transistor 22 is connected to the gate terminal of the P-MOS transistor 22, to the gate terminal of the P-MOS transistor 28 and to the source terminal of a P-MOS transistor 24. The P-MOS transistor 24 has its gate terminal connected to its drain terminal. Both terminals are connected to ground.

A bias current I provided by a bias current source 18 is forced into a current mirror comprising P-MOS transistors 16 and 14. The output current of the current mirror delivered from the drain terminal of the P-MOS transistor 14, flows into the series connection of N-MOS transistor 20, P-MOS transistor 22 and P-MOS transistor 24. Because the transistors 30, 28 and 26 are chosen to have the same properties as the transistors 20, 22 and 24 respectively, the same voltages will be present on the terminals of the transistors 26 and 24. This will cause a same current I to flow through the series connection of the transistors 26, 28 and 30, and through the transistor 12. Consequently, across the transistors 12 and 26 a same voltage $V_B$ is generated.

The operation of the combination of the transistors 4, 10, 11 and 15 was already explained with reference to FIGS. 1 and 2. The voltage across the P-MOS transistor 10 is equal to $V_H-V_L+V_B$. Due to the feedback loop around an operational amplifier 32 and a source follower circuit comprising an N-MOS transistor 34 and a resistor 36, the voltage developed between the input terminals of the operational amplifier is substantially 0. Because the voltage across the P-MOS transistor 26 is equal to $V_B$, the output of the source follower is equal to $(V_H-V_L+V_B)-V_B=V_H-V_L$.

Figure 4:
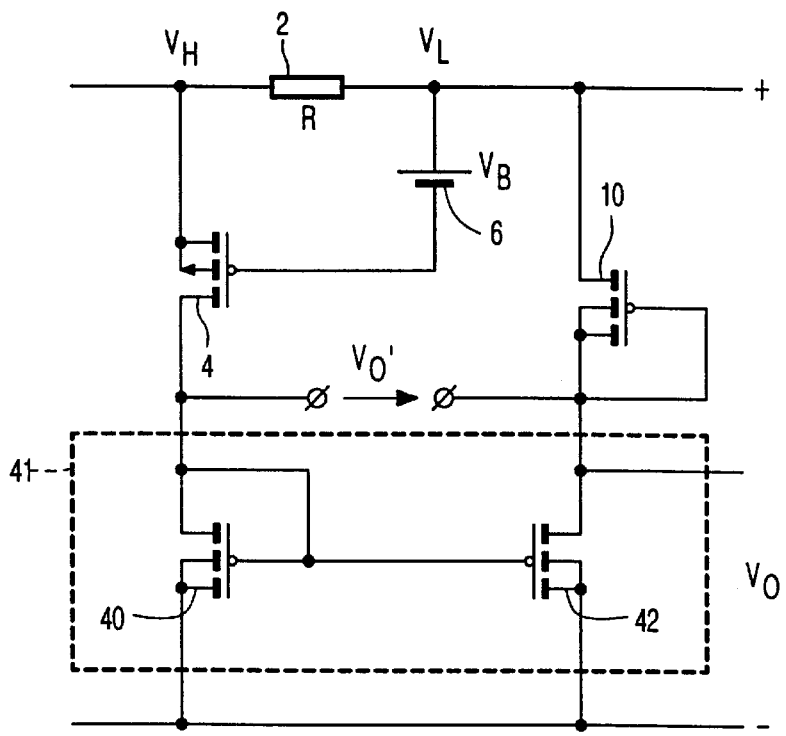
FIG. 4 shows an alternative embodiment of the current measuring device according to the present invention.

In the alternative embodiment of the invention according to FIG. 4, the current coupling means 5 of the circuit according to FIG. 1 are now replaced by current coupling means 41 which comprise a current mirror consisting of N-MOS transistors 40 and 42. The operation of the circuit according to FIG. 4 is similar to the operation of the circuit according to FIG. 1. The operational amplifier 32 in FIG. 3 is present to provide the circuit with adequate drive capabilities.

The voltage across the resistor 2, is converted into a current by the P-MOS transistor 4. This current is mirrored by N-MOS transistor 40 into N-MOS transistor 42, which passes the mirrored current to the P-MOS transistor 10. In the same way as was discussed with respect to FIG. 1, a voltage which is proportional to the voltage $V_H-V_L$ will develop across P-MOS transistor 10. It is observed that the output voltage $V_o$ with respect to ground is inverted with respect to the voltage $V_H-V_L$ and it comprises an offset value $V_B$. If this causes problems in following circuits, a simple inverter can be used to invert the output voltage $V_O$.

If the output signal $V_o'$ of the circuit according to FIG. 4 is taken between the drain of the P-MOS transistor 4 and the drain of the P-MOS transistor 10, the offset voltage is completely eliminated when the P-MOS transistors 4 and 10 are matched and the P-MOS transistors 40 and 42 are matched.

Figure 5:
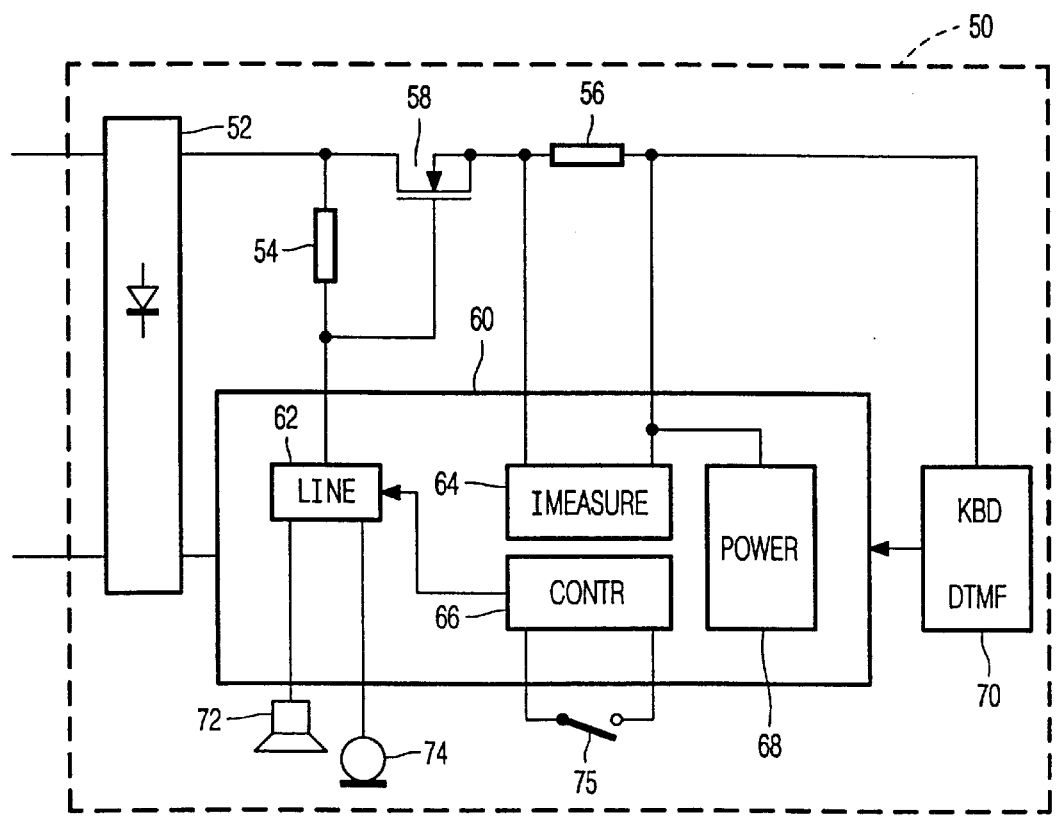
FIG. 5 shows a block diagram of a telephone terminal according to the invention.

In the telephone terminal 50 according to FIG. 5, the telephone line is connected to a full wave rectifier 52 which provides a unipolar voltage irrespective of how the line is connected to the telephone terminal 50. A first output terminal of the full wave rectifier 52 is connected to a first terminal of a resistor 54 and to a source terminal of a P-MOS transistor 58. A second terminal of the resistor 54 is connected to a first terminal of an integrated circuit 60 and to a gate terminal of the P-MOS transistor 58. A drain terminal of the P-MOS transistor 58 is connected to a second input of the integrated circuit 60 and to a first terminal of a current measuring resistor 56. A second terminal of the current measuring resistor 56 is connected to a third terminal of the integrated circuit 60 and to a supply terminal of a keyboard controller 70.

If the telephone terminal is off hook, the integrated circuit 60 is provided with a supply voltage via the resistor 54. If the telephone terminal goes off hook, which is detected by the closing of the hook switch 75, a controller 66 in the integrated circuit 60 causes the gate voltage of the P-MOS transistor to be lowered, causing the P-MOS transistor 58 to conduct. This causes additional elements of the integrated circuit 60 and the keyboard controller to be provided with a supply voltage.

A current measuring device 64 which is connected to the second and third terminal of the integrated circuit 60 comprises a circuit according to FIG. 1, 2 or 3 which determines the line current from the voltage across the current measuring resistor 56.

In response to the value of the line current, the controller 66 sets some parameters of the line interface to a corresponding value. These parameters can be the gain to be used for the microphone 74 and the gain used for the earpiece 72, but these parameters are also used to achieve optimum side tone suppression. These gain values will increase with decreasing line current, because a lower line current indicates a longer line having more DC resistance, but also having a larger attenuation for the audio signal.

The keyboard interface 70 is arranged for decoding the signals received from the keyboard and to generate DTMF signals as used for dialing and other signaling purposes.

What is claimed is:

1. Current measuring arrangement comprising: an output terminal for providing an output voltage proportional to a current to be measured, a first field effect device and a second field effect device, a current sensing resistor having a first terminal and a second terminal and which passes the current to be measured, a gate electrode of the first field effect device being coupled to the first terminal of the current sensing resistor, a source electrode of the first field effect device being coupled to the second terminal of the current sensing resistor, a drain electrode of the first field effect device being coupled to a current coupling device for causing a current dependent on the drain current of the first field effect device to flow in the second field effect device, and an output coupling device for supplying to the output terminal an output voltage derived from the voltage between a gate and a source terminal of the second field effect device.

2. Current measuring arrangement according to claim 1, which further comprises an offset voltage source for offsetting the gate voltage of the first field effect device with respect to the source voltage of the first field effect device.

3. Current measuring arrangement according to claim 2, which further comprises a further offset source for offsetting the output voltage of the current measuring device with respect to the voltage between the gate and the source terminal of the second field effect device.

4. Current measuring arrangement according to claim 1, characterized in that the current coupling device comprises a cascode field effect device coupled between the drain terminal of the first field effect device and the source terminal of the second field effect device, the gate of the cascode field effect device being coupled to a reference source.

5. Voltage measuring arrangement comprising: an output terminal for providing an output voltage proportional to a voltage between a first and a second input terminal, a first and a second field effect device, a gate electrode of the first field effect device being coupled to the first input terminal, a source electrode of the first field effect device being coupled to the second input terminal, a drain electrode of the first field effect device being coupled to a source electrode of the second field effect device, a drain and a gate electrode of the second field effect device being coupled to a reference voltage, and means coupling the source electrode of the second field effect device to the output terminal.

6. Voltage measuring arrangement according to claim 5, which further comprises an offset voltage source for offsetting the gate voltage of the first field effect device with respect to the source voltage of the first field effect device.

7. Voltage measuring arrangement according to claim 6, which further comprises a further offset voltage source for offsetting the output voltage at the output terminal with respect to the source electrode of the second field effect device.

8. Voltage measuring arrangement according to claim 5, which further comprises a cascode field effect device coupled between the drain terminal of the first field effect device and the source terminal of the second field effect device, the gate of the cascode field effect device being coupled to a reference source.

9. Telephone terminal comprising a current measuring device according to claim 1, a rectifier coupled to a telephone line, means connecting a field effect transistor and the current sensing resistor in series to an output terminal of the rectifier, a resistor coupling the rectifier output terminal to a gate electrode of the field effect transistor, and a controller which controls conduction of the field effect transistor in response to operation of a hook switch.

10. A current measuring apparatus comprising:
   a current sensing resistor through which a current to be measured is passed,
   first and second transistors each having a control electrode and respective corresponding first main electrodes and respective corresponding second main electrodes,
   means coupling the control electrode and the first main electrode of the first transistor to a first terminal and a second terminal, respectively, of the current sensing resistor,
   a current coupling device coupling the second main electrode of the first transistor to the second transistor so as to cause a current dependent on the second main electrode current of the first transistor to flow in the second transistor, and
   an output coupling device for supplying to an output terminal an output voltage derived from a voltage between the control electrode and one main electrode of the second transistor.

11. The current measuring apparatus as claimed in claim 10 further comprising a first source of offset voltage ($V_B$) for offsetting the control electrode voltage of the first transistor with respect to the voltage at the first main electrode of the first transistor.

12. The current measuring apparatus as claimed in claim 11 which further comprises a second source of offset voltage coupled to the output terminal for offsetting the output voltage at the output terminal with respect to the voltage between the control electrode and the one main electrode of the second transistor.

13. The current measuring apparatus as claimed in claim 11 wherein the first and second transistor are field effect transistors of the same type, the first and second main electrodes being the source and drain electrodes, respectively and the control electrodes being the respective gate electrodes, and wherein $IR+V_B>V_T$ where I is the current in the current sensing resistor, R is the resistance thereof, and $V_T$ is the threshold voltage of the first field effect transistor.

14. The current measuring apparatus as claimed in claim 10 wherein the first and second transistors are field effect transistors of the same type, the first and second main electrodes being the source and drain electrodes, respectively, and the control electrodes being the respective gate electrodes, wherein
   the current coupling device connects the drain electrode of the first field effect transistor to the source electrode of the second field effect transistor, and
   the gate and drain electrodes of the second field effect transistor are connected together and to a point of reference voltage.

15. The current measuring apparatus as claimed in claim 10 wherein the current coupling device couples the second main electrode of the first transistor to the first main electrode of the second transistor, and
   a source of offset voltage is coupled between the output terminal and a circuit point between the second main electrode of the first transistor and the first main electrode of the second transistor.

16. The current measuring apparatus as claimed in claim 15 further comprising a further source of offset voltage for offsetting the control electrode voltage of the first transistor with respect to the first main electrode voltage of the first transistor.

17. The current measuring apparatus as claimed in claim 10 wherein the first and second transistors are matched field effect transistors of the same type whereby the output voltage at the output terminal is approximately linearly related to the current which passes through the current sensing resistor.

18. The current measuring apparatus as claimed in claim 12 wherein the voltage of the second source of offset voltage is equal to the voltage of the first source of offset voltage ($V_B$).

19. The current measuring apparatus as claimed in claim 10 wherein the first and second transistors are field effect transistors of the same type.

20. The current measuring arrangement as claimed in claim 4 wherein the first and second field effect devices and the cascode field effect device are field effect transistors of the same type, and the reference source includes a third field effect transistor of the same type as the first and second and cascode field effect transistors and with a source electrode coupled to the source electrode of the first field effect transistor, a drain electrode coupled to the gate electrode of the cascode field effect transistor, and a gate electrode coupled to the drain and source electrodes of the first and cascode field effect transistors, respectively, whereby the cascode and third field effect transistors cooperate so as to keep the voltage on the drain electrode of the first field effect transistor constant.

21. The current measuring arrangement as claimed in claim 4 wherein the first, second and cascode field effect devices are field effect transistors of the same conductivity type.

22. The current measuring apparatus as claimed in claim 10 wherein the current coupling device comprises a current mirror having a first terminal coupled to the second main electrode of the first transistor, a second terminal coupled to the second main electrode of the second transistor, and a third terminal coupled to a source of reference voltage, wherein the output terminal is coupled to the second terminal of the current mirror.

23. The current measuring apparatus as claimed in claim 22 wherein the first main electrode of the second transistor is coupled to the second terminal of the current sensing resistor and the control electrode and second main electrode of the second transistor are directly connected together.

24. A voltage measuring apparatus comprising:

first and second input terminals for a voltage to be measured, an output terminal providing an output voltage proportional to a voltage between the first and second input terminals, first and second transistors each having a control electrode and respective corresponding first main electrodes and respective corresponding second main electrodes, first means coupling the control electrode and first main electrode of the first transistor to the first and second input terminals, respectively, second means coupling the second main electrode of the first transistor to the first main electrode of the second transistor, third means coupling the second main electrode and control electrode of the second transistor to a reference voltage, and fourth means coupling the first main electrode of the second transistor to the output terminal.

25. The voltage measuring apparatus as claimed in claim 24 wherein the first and second transistors are field effect transistors of the same type.

26. The voltage measuring apparatus as claimed in claim 25 further comprising a first source of offset voltage ($V_B$) for offsetting the control electrode voltage of the first transistor with respect to the first main electrode voltage of the first transistor, and wherein $V_B > V_T$, where $V_T$ is the threshold voltage of the first field effect transistor.

27. The voltage measuring apparatus as claimed in claim 26 which further comprises a second source of offset voltage coupled to the output terminal for offsetting the output voltage at the output terminal with respect to the voltage at the source electrode of the second field effect transistor.

28. The current measuring arrangement as claimed in claim 1 wherein the current coupling device couples the drain electrode of the first field effect device to the source electrode of the second field effect device.

* * * * *